United States Patent
Zuo et al.

(10) Patent No.: US 10,103,135 B2
(45) Date of Patent: Oct. 16, 2018

(54) BACKSIDE GROUND PLANE FOR INTEGRATED CIRCUIT

(71) Applicant: QUALCOMM Incorporated, San Diego, CA (US)

(72) Inventors: Chengjie Zuo, San Diego, CA (US); Jonghae Kim, San Diego, CA (US); David Francis Berdy, San Diego, CA (US); Changhan Hobie Yun, San Diego, CA (US); Niranjan Sunil Mudakatte, San Diego, CA (US); Mario Francisco Velez, San Diego, CA (US); Shiqun Gu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 106 days.

(21) Appl. No.: 15/275,068

(22) Filed: Sep. 23, 2016

(65) Prior Publication Data
US 2018/0090475 A1    Mar. 29, 2018

(51) Int. Cl.
*H01L 27/01* (2006.01)
*H01L 21/56* (2006.01)
(Continued)

(52) U.S. Cl.
CPC .............. *H01L 27/01* (2013.01); *H01L 21/56* (2013.01); *H01L 21/76885* (2013.01); *H01L 23/3128* (2013.01); *H01L 23/3135* (2013.01); *H01L 23/49805* (2013.01); *H01L 23/5226* (2013.01); *H01L 23/5286* (2013.01); *H01L 23/552* (2013.01); *H03H 7/0115* (2013.01); *H03H 7/468* (2013.01); *H04B 1/0057* (2013.01);
(Continued)

(58) Field of Classification Search
CPC ...... H04L 27/01; H03H 7/0115; H03H 7/468; H01L 23/3121; H01L 24/13; H01L 24/16; H01L 2224/131; H01L 2224/16227; H01L 2224/16235; H01L 2924/14; H01L 2924/15313; H01L 2924/19011; H01L 2924/3025; H01L 21/56; H01L 21/76885; H01L 23/3128; H01L 23/3135; H01L 23/49805; H01L 23/5226; H01L 23/5286; H01L 23/552
See application file for complete search history.

(56) References Cited

U.S. PATENT DOCUMENTS

| 5,311,059 A | 5/1994 | Banerji et al. |
| 7,851,893 B2 | 12/2010 | Kim et al. |

(Continued)

OTHER PUBLICATIONS

International Search Report and Written Opinion—PCT/US2017/051186—ISA/EPO—dated Dec. 1, 2017.

(Continued)

*Primary Examiner* — Ajay Cattungal
(74) *Attorney, Agent, or Firm* — Seyfarth Shaw LLP

(57) ABSTRACT

An integrated circuit (IC) device includes a die having an integrated passive device (IPD) layer. The integrated circuit device also includes a substrate supporting the die, a molding compound surrounding the die. The integrated circuit device further includes a backside conductive layer on a surface of the die that is distal from the IPD layer. The integrated circuit device also includes vias coupling the backside conductive layer to a ground plane through the molding compound.

19 Claims, 10 Drawing Sheets

(51) Int. Cl.
  *H01L 21/768* (2006.01)
  *H01L 23/31* (2006.01)
  *H01L 23/498* (2006.01)
  *H01L 23/522* (2006.01)
  *H01L 23/528* (2006.01)
  *H01L 23/552* (2006.01)
  *H03H 7/01* (2006.01)
  *H03H 7/46* (2006.01)
  *H04B 1/00* (2006.01)
  *H01L 23/00* (2006.01)

(52) U.S. Cl.
  CPC .......... *H01L 23/3121* (2013.01); *H01L 24/13* (2013.01); *H01L 24/16* (2013.01); *H01L 2224/131* (2013.01); *H01L 2224/16227* (2013.01); *H01L 2224/16235* (2013.01); *H01L 2924/14* (2013.01); *H01L 2924/15313* (2013.01); *H01L 2924/19011* (2013.01); *H01L 2924/3025* (2013.01)

(56) References Cited

U.S. PATENT DOCUMENTS

| | | |
|---|---|---|
| 7,880,275 B2 | 2/2011 | Pagaila et al. |
| 8,310,064 B2 | 11/2012 | Kosowsky |
| 2007/0045829 A1 | 3/2007 | Jeong et al. |
| 2013/0323408 A1* | 12/2013 | Read ..................... H01L 23/552 427/98.4 |
| 2013/0335288 A1* | 12/2013 | Read ..................... H01L 23/552 343/841 |
| 2014/0002188 A1* | 1/2014 | Chen ..................... H03F 3/19 330/250 |
| 2014/0016277 A1* | 1/2014 | Chen ..................... H05K 1/181 361/728 |
| 2014/0239427 A1 | 8/2014 | Huang et al. |
| 2015/0348936 A1* | 12/2015 | Lin ..................... H01L 23/552 257/659 |
| 2016/0005628 A1* | 1/2016 | Yap ..................... H01L 21/561 257/774 |
| 2016/0172309 A1* | 6/2016 | Gong ..................... H01L 24/97 257/659 |
| 2017/0033062 A1* | 2/2017 | Liu ..................... H01L 23/66 |
| 2017/0207173 A1* | 7/2017 | Hsu ..................... H01L 23/5389 |

OTHER PUBLICATIONS

Lin Y-S., et al., "Miniature Butler Matrix Design Using Glass-Based Thin-Film Integrated Passive Device Technology for 2.5-GHz Applications", IEEE Transactions on Microwave Theory and Techniques, vol. 61, No. 7, Jul. 1, 2013 (Jul. 1, 2013), XP055428341, pp. 2594-2602.

* cited by examiner

BACKSIDE GROUND PLANE FOR INTEGRATED CIRCUIT

BACKGROUND

Field

Aspects of the present disclosure relate to semiconductor devices, and more particularly to a radio frequency (RF) module including a backside ground plane integrated with a shielding ground plane.

Background

Mobile radio frequency (RF) chip designs (e.g., mobile RF transceivers), including high performance multiplexers, have migrated to a deep sub-micron process node due to cost and power consumption considerations. The design of such mobile RF transceivers becomes complex at this deep sub-micron process node. The design complexity of these mobile RF transceivers is further complicated by added circuit functions to support communication enhancements, such as carrier aggregation. Further design challenges for mobile RF transceivers include analog/RF performance considerations, including mismatch, noise and other performance considerations. The design of these mobile RF transceivers includes the use of additional passive devices, for example, to suppress resonance, and/or to perform filtering, bypassing and coupling.

Passive on glass (POG) devices involve high performance inductor and capacitor components that have a variety of advantages over other technologies, such as surface mount technology or multi-layer ceramic chips that are commonly used in the fabrication of mobile radio frequency (RF) chip designs. The design complexity of mobile RF transceivers is complicated by the migration to a deep sub-micron process node due to cost and power consumption considerations. Spacing considerations also affect mobile RF transceiver design at deep sub-micron process nodes. For example, a distance between passive devices (e.g., passive on glass (POG) devices or integrated passive devices (IPD) such as inductors) and a ground plane of a system board (e.g., a printed circuit broad (PCB)) affects inductance values and also performance of the RF devices of the RF transceiver.

SUMMARY

An integrated circuit (IC) device includes a die having an integrated passive device (IPD) layer. The integrated circuit device also includes a substrate supporting the die, a molding compound surrounding the die. The integrated circuit device further includes a backside conductive layer on a surface of the die that is distal from the IPD layer. The integrated circuit device also includes vias coupling the backside conductive layer to a ground plane through the molding compound.

A method of fabricating an integrated circuit (IC) device includes plating a backside conductive layer on a backside of a die including an integrated passive device (IPD) layer. The method also includes attaching a front side of the die to a packaging substrate. The method further includes spreading a molding material on the packaging substrate to surround the die with a molding compound. The method also includes exposing the backside conductive layer on the die through the molding compound. The method further includes depositing a conductive material on the molding compound. The conductive material contacts the backside conductive layer on the die and providing a ground plane for the IPD layer.

An integrated circuit (IC) device includes a die having an integrated passive device (IPD) layer. The integrated circuit device also includes a substrate supporting the die and a molding compound surrounding the die. The integrated circuit device further includes a backside conductive layer on a surface of the die that is distal from the IPD layer. The integrated circuit device also includes means for coupling the backside conductive layer to a ground plane.

A radio frequency (RF) front end module includes a filter, having a die including an integrated passive device (IPD) layer. The filter also includes a substrate supporting the die, a molding compound surrounding the die, a backside conductive layer on a surface of the die that is distal from the IPD layer, and vias coupling the backside conductive layer to a ground plane. The radio frequency front end module also includes a diplexer coupled to the filter. The radio frequency front end module further includes an antenna coupled to an output of the diplexer.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

DETAILED DESCRIPTION

Figure 1A:
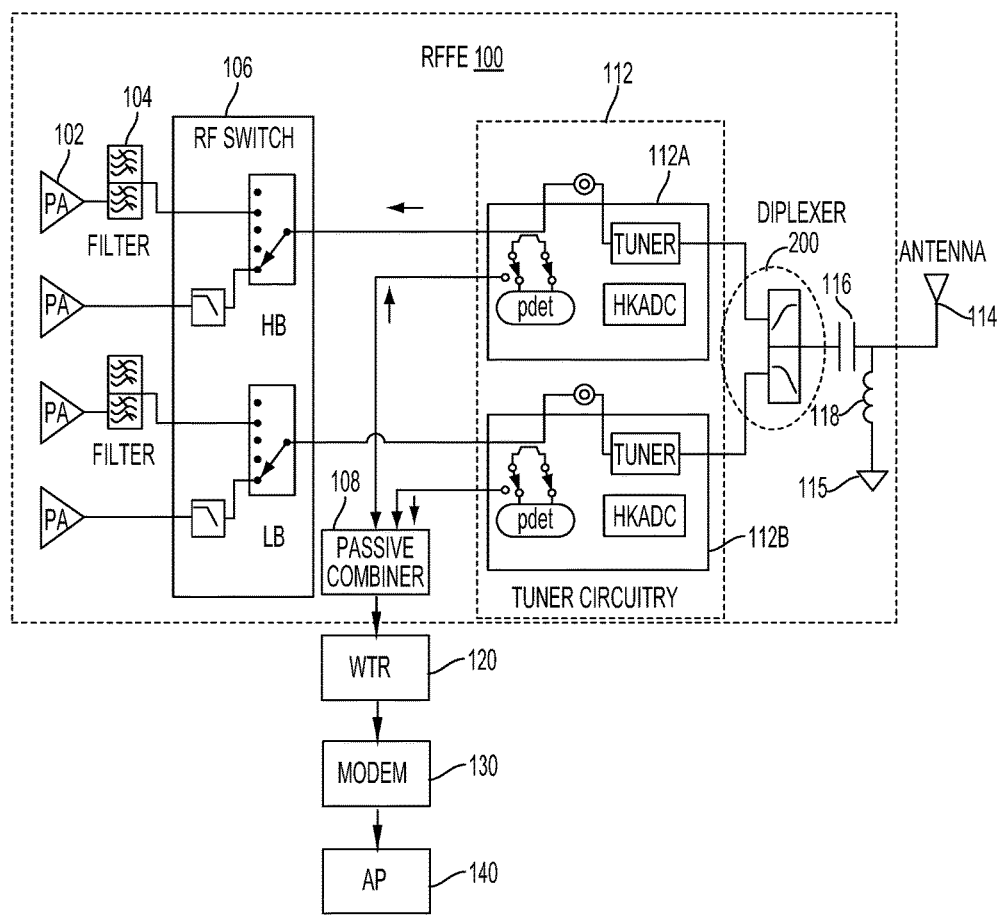
FIG. 1A is a schematic diagram of a radio frequency (RF) front end (RFFE) module employing a diplexer according to an aspect of the present disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Successful fabrication of modern semiconductor chip products involves interplay between the materials and the processes employed. In particular, the formation of passive devices during semiconductor fabrication in back-end-of-line (BEOL) processes is an increasingly challenging part of the process flow. This is particularly true in terms of maintaining a small feature size. The same challenge of maintaining a small feature size also applies to passive on glass (POG) technology, where high performance components such as inductors and capacitors are built upon a highly insulative substrate that may also have a very low loss to support mobile radio frequency (RF) chip designs (e.g., mobile RF transceivers).

Passive on glass devices involve high performance inductor and capacitor components that have a variety of advantages over other technologies, such as surface mount technology or multi-layer ceramic chips that are commonly used in the fabrication of mobile RF chip designs. An RF module may include inductors and capacitors arranged to form diplexers, triplexers, multiplexers, low pass filters, balun filters, and/or notch filters to prevent high order harmonics. These passive devices and components may be implemented as passive on glass devices, integrated passive devices, or other like passive devices. The inductors may be three-dimensional (3D) inductors or two-dimensional (2D) spiral inductors.

The design of such mobile RF transceivers becomes complex at deep sub-micron process nodes due to cost and power consumption considerations. Further design challenges for mobile RF transceivers include analog/RF performance considerations, including mismatch, noise and other performance considerations. The design of these mobile RF transceivers includes the use of additional passive devices, for example, to suppress resonance, and/or to perform filtering, bypassing and coupling. Arrangement of these passive devices may be selected to improve device performance, while suppressing unwanted noise (e.g., artificial harmonics) to support advanced RF applications such as carrier aggregation. One possible configuration of these passive devices is an arrangement of the passive devices within an integrated passive device (IPD) layer.

The design complexity of these mobile RF transceivers is further complicated by added circuit functions to support communication enhancements, such as carrier aggregation. The implementation of carrier aggregation in mobile RF transceivers enables a wireless carrier to maximize available bandwidth by simultaneously using multiple frequencies for a single communication stream. While an increased amount of data is provided to the end user, successful implementation of carrier aggregation is complicated by noise created at the harmonic frequencies due to the frequencies used for data transmission. This noise is reduced when passive devices are used to process signals carried in a carrier aggregation system.

Unfortunately, spacing considerations also affect mobile RF transceiver design at deep sub-micron process nodes. For example, a distance between passive devices (e.g., passive on glass (POG) devices or integrated passive devices (IPD)) and a ground plane of a system board (e.g., a printed circuit broad (PCB)) may negatively affect the performance of the RF devices of the RF transceiver. In particular, variation of the ground plane distance may change the inductance values and therefore negatively affect the passive circuit performance.

According to aspects of the present disclosure, a backside ground plane is added to a passive die of an RF module by depositing a conductive layer on a backside of the passive die, distal from an integrated passive device layer. This feature enables strict control over the distance between the integrated passive device layer and the backside ground plane. In particular, strict control over a thickness (e.g., height) of the passive die prevents the backside ground plane from negatively affecting the performance of the integrated passive devices by avoiding inductance change due to thickness variation during the fabrication process. Aspects of the present disclosure integrate a shielding ground plane of the RF module and the backside ground plane of a passive die, thereby avoiding the use of a substrate ground plane using an interconnect layer (e.g., metal three (M3)). The shielding ground plane may be provided by electrically coupling the backside ground plane to a shielding layer partially surrounding the RF module.

For wireless communication, passive devices are used to process signals in a carrier aggregation system. In carrier aggregation systems, signals are communicated with both high band and low band frequencies. In a chipset, a passive device (e.g., a diplexer) is usually inserted between an antenna and a tuner (or a radio frequency (RF) switch) to ensure high performance. Usually, a diplexer design includes inductors and capacitors. Diplexers can attain high performance by using inductors and capacitors that have a high quality (Q)-factor. High performance diplexers can also be attained by reducing the electromagnetic coupling between components, which may be achieved through an arrangement of the geometry and direction of the components.

FIG. 1A is a schematic diagram of a radio frequency (RF) front end (RFFE) module 100 employing a diplexer 200 according to an aspect of the present disclosure. The RF front end module 100 includes power amplifiers 102, duplexer/filters 104, and a radio frequency (RF) switch module 106. The power amplifiers 102 amplify signal(s) to a certain power level for transmission. The duplexer/filters 104 filter the input/output signals according to a variety of different parameters, including frequency, insertion loss, rejection or other like parameters. In addition, the RF switch module 106 may select certain portions of the input signals to pass on to the rest of the RF front end module 100.

The radio frequency (RF) front end module 100 also includes tuner circuitry 112 (e.g., first tuner circuitry 112A and second tuner circuitry 112B), the diplexer 200, a capacitor 116, an inductor 118, a ground terminal 115 and an antenna 114. The tuner circuitry 112 (e.g., the first tuner circuitry 112A and the second tuner circuitry 112B) includes components such as a tuner, a portable data entry terminal (PDET), and a house keeping analog to digital converter (HKADC). The tuner circuitry 112 may perform impedance tuning (e.g., a voltage standing wave ratio (VSWR) optimization) for the antenna 114. The RF front end module 100 also includes a passive combiner 108 coupled to a wireless transceiver (WTR) 120. The passive combiner 108 combines the detected power from the first tuner circuitry 112A and the second tuner circuitry 112B. The wireless transceiver 120 processes the information from the passive combiner 108 and provides this information to a modem 130 (e.g., a mobile station modem (MSM)). The modem 130 provides a digital signal to an application processor (AP) 140.

As shown in FIG. 1A, the diplexer 200 is between the tuner component of the tuner circuitry 112 and the capacitor 116, the inductor 118, and the antenna 114. The diplexer 200 may be placed between the antenna 114 and the tuner circuitry 112 to provide high system performance from the RF front end module 100 to a chipset including the wireless transceiver 120, the modem 130 and the application processor 140. The diplexer 200 also performs frequency domain multiplexing on both high band frequencies and low band frequencies. After the diplexer 200 performs its frequency multiplexing functions on the input signals, the output of the diplexer 200 is fed to an optional LC (inductor/capacitor) network including the capacitor 116 and the inductor 118. The LC network may provide extra impedance matching components for the antenna 114, when desired. Then a signal with the particular frequency is transmitted or received by the antenna 114. Although a single capacitor and inductor are shown, multiple components are also contemplated.

Figure 1B:
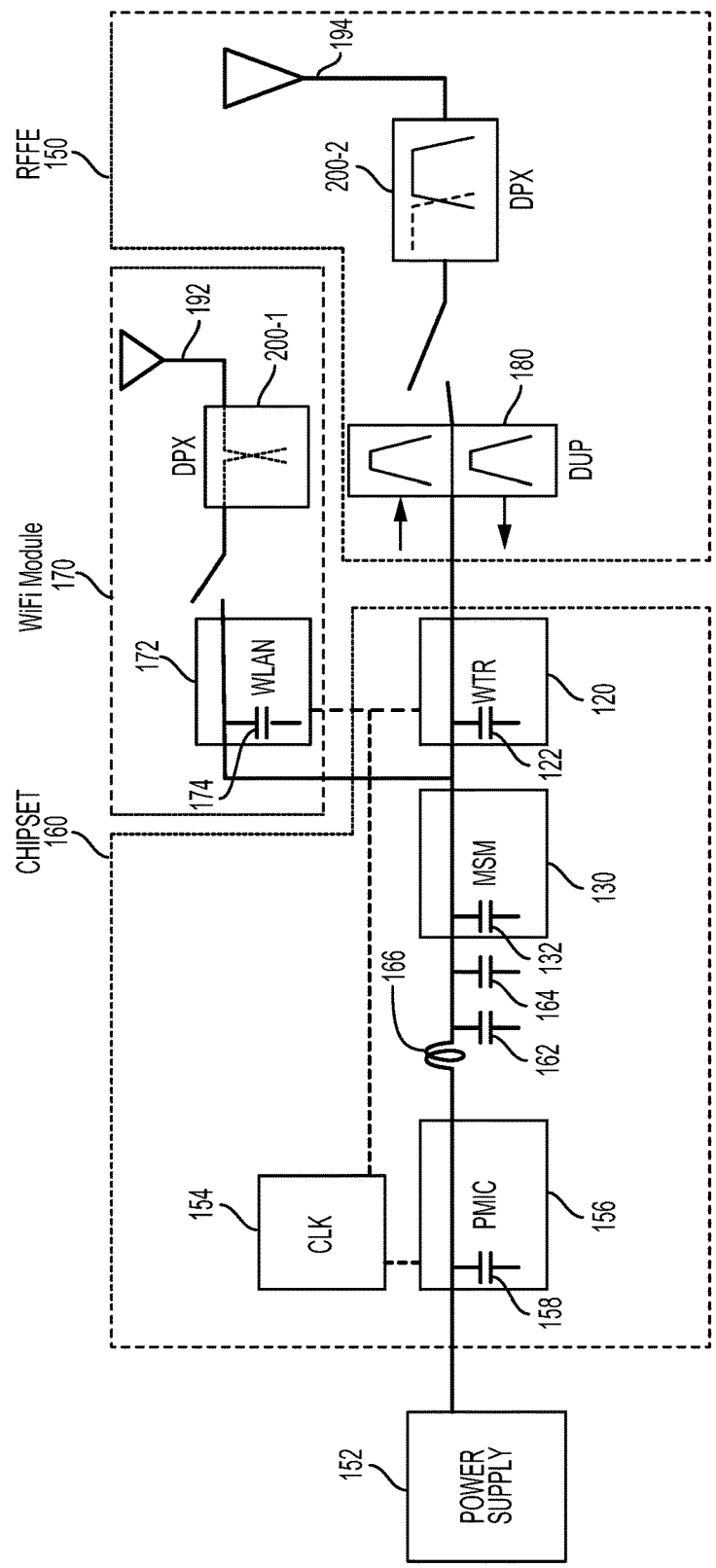
FIG. 1B is a schematic diagram of a radio frequency (RF) front end (RFFE) module employing diplexers for a chipset to provide carrier aggregation according to aspects of the present disclosure.

FIG. 1B is a schematic diagram of a wireless local area network (WLAN) (e.g., WiFi) module 170 including a first diplexer 200-1 and an RF front end (RFFE) module 150 including a second diplexer 200-2 for a chipset 160 to provide carrier aggregation according to an aspect of the present disclosure. The WiFi module 170 includes the first diplexer 200-1 communicably coupling an antenna 192 to a wireless local area network module (e.g., WLAN module 172). The RF front end module 150 includes the second diplexer 200-2 communicably coupling an antenna 194 to the wireless transceiver (WTR) 120 through a duplexer 180. The wireless transceiver 120 and the WLAN module 172 of the WiFi module 170 are coupled to a modem (MSM, e.g., baseband modem) 130 that is powered by a power supply 152 through a power management integrated circuit (PMIC) 156. The chipset 160 also includes capacitors 162 and 164, as well as an inductor(s) 166 to provide signal integrity. The PMIC 156, the modem 130, the wireless transceiver 120, and the WLAN module 172 each include capacitors (e.g., 158, 132, 122, and 174) and operate according to a clock 154. The geometry and arrangement of the various inductor and capacitor components in the chipset 160 may reduce the electromagnetic coupling between the components.

Figure 2A:
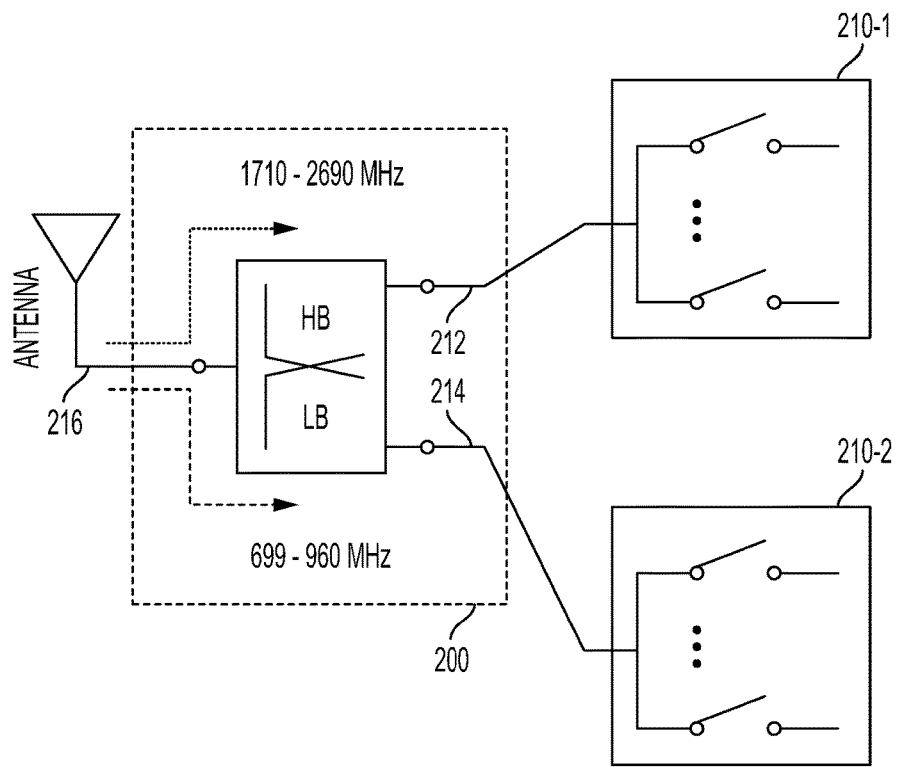
FIG. 2A is a diagram of a diplexer design in accordance with an aspect of the present disclosure.

FIG. 2A is a diagram of a diplexer 200 according to an aspect of the present disclosure. The diplexer 200 includes a high band (HB) input port 212, a low band (LB) input port 214, and an antenna 216. A high band path of the diplexer 200 includes a high band antenna switch 210-1. A low band path of the diplexer 200 includes a low band antenna switch 210-2. A wireless device including an RF front end module may use the antenna switches 210 and the diplexer 200 to enable a wide range band for an RF input and an RF output of the wireless device. In addition, the antenna 216 may be a multiple input, multiple output (MIMO) antenna. Multiple input, multiple output antennas will be widely used for the RF front end of wireless devices to support features such as carrier aggregation.

Figure 2B:
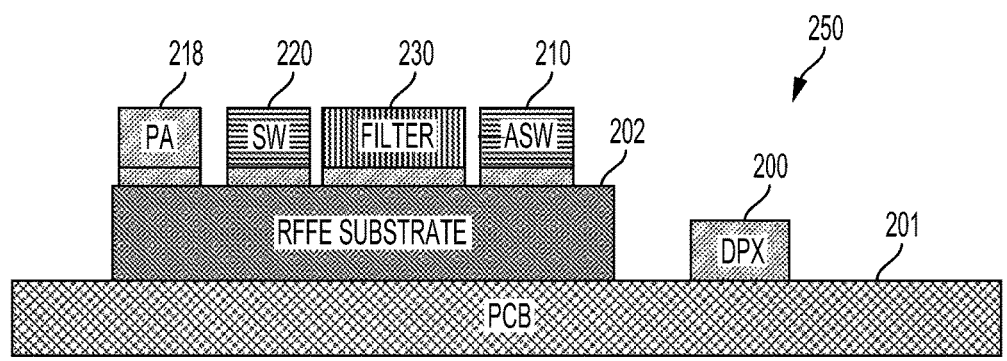
FIG. 2B is a diagram of a radio frequency (RF) front end (RFFE) module in accordance with an aspect of the present disclosure.

FIG. 2B is a diagram of an RF front end module 250 according to an aspect of the present disclosure. The RF front end module 250 includes the antenna switch (ASW) 210 and diplexer 200 (or triplexer) to enable the wide range band noted in FIG. 2A. In addition, the RF front end module 250 includes filters 230, an RF switch 220 and power amplifiers 218 supported by a substrate 202. The filters 230 may include various LC filters, having inductors (L) and capacitors (C) arranged along the substrate 202 for forming a diplexer, a triplexer, low pass filters, balun filters, and/or notch filters to prevent high order harmonics in the RF front end module 250.

In this configuration, the diplexer 200 is implemented as a surface mount device (SMD) on a system board 201 (e.g., printed circuit board (PCB) or package substrate). By contrast, the antenna switch 210 is implemented on the substrate 202 supported by the system board 201 of the RF front end module 250. In addition, the various LC filters of the filters 230 are also implemented as surface mount devices on the substrate 202 of the RF front end module 250. Although shown as filters 230, the LC filters including a low pass filter(s) and/or a notch filter(s) may be arranged throughout the substrate using pick and place technology to prevent high order harmonics in the RF front end module 250.

The RF front end module 250 may include inductors (L) and capacitors (C) arranged to form diplexers, a triplexers, multiplexers, low pass filters, balun filters, and/or notch filters to prevent high order harmonics. These passive devices and components may be implemented as passive on glass devices, integrated passive devices, or other like passive devices. The inductors may be three-dimensional (3D) inductors or two-dimensional (2D) spiral inductors. Arrangement of these passive devices may be performed and selected to improve device performance, while suppressing unwanted noise (e.g., artificial harmonics) to support advance RF applications such as carrier aggregation. One possible configuration of these passive devices is an arrangement of the passive devices within a passive device layer, for example.

Figure 3:
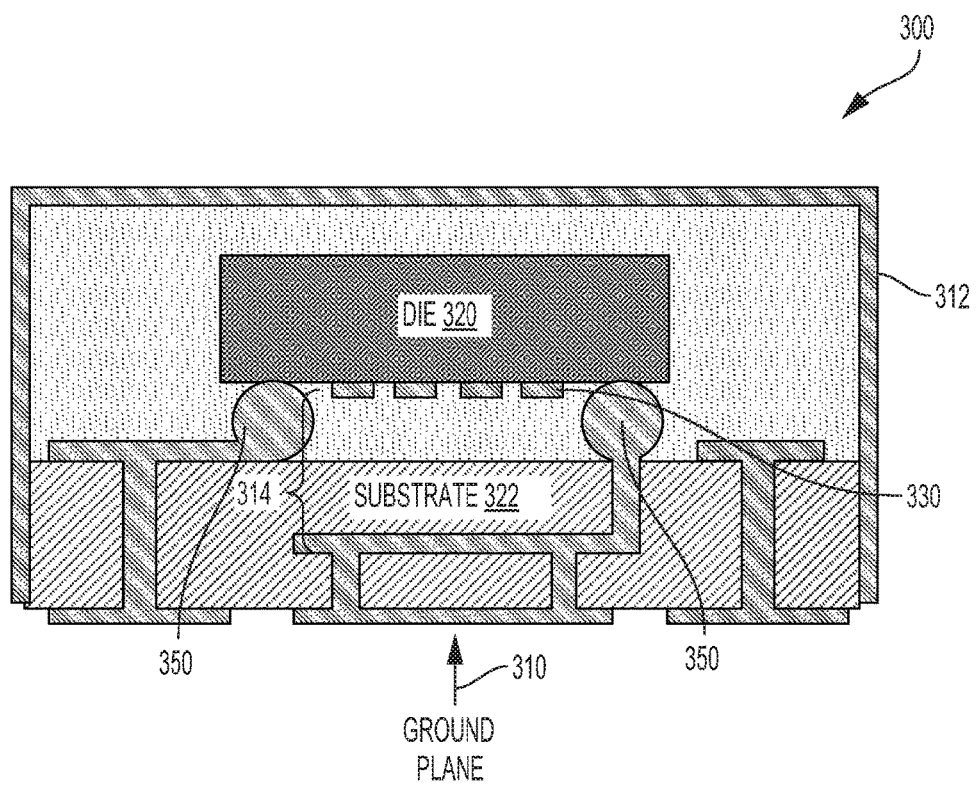
FIG. 3 is a cross-sectional view illustrating an integrated circuit (IC) device including a ground plane and a shielding layer.

FIG. 3 is a cross-sectional view illustrating an integrated circuit (IC) device 300 including a ground plane 310. The integrated circuit device 300 (e.g., a radio frequency (RF) module) includes a die 320 (e.g., a glass die) supported by a substrate 322 (e.g., a package substrate) and partially surrounded by a shielding layer 312. The die 320 may include an integrated passive device (IPD) layer 330, including interconnected inductors and capacitors. In this arrangement, conductive interconnects 350 electrically couple the die 320 to the ground plane 310 of the substrate 322 (e.g., a package substrate). The ground plane 310 may be formed from an interconnect layer (e.g., an M3 layer) of the substrate 322.

In operation, a distance 314 between the integrated passive device layer 330 and the ground plane 310 may be subject to substrate process variations and also flip-chip bump height variations, and therefore negatively affect the operation of the integrated circuit device 300. In particular, when the distance 314 is less than three-hundred (300) microns, the inductor magnetic field from the integrated passive device layer 330 interacts with the ground plane 310, which negatively affects a performance (e.g., a quality (Q)-factor) of the passive devices in the integrated passive device layer 330.

Unfortunately, solving this problem by simply controlling the distance 314 is difficult because the specification of the ground plane 310 of the substrate 322 generally varies according to a specific design and/or customer specifications. In addition, controlling a height of the conductive interconnects 350 (e.g., solder balls) that couple the die 320 to the substrate 322 is challenging due to the complex assembly process for fabricating the integrated circuit device 300.

Additionally, as circuits get smaller, circuit components become spaced closer together, which leads to interference between the circuit components. As a result, the shielding layer 312 acts as a barrier to prevent interference between the components. Nevertheless, depending on a distance between the integrated passive device layer 330 and the shielding layer 312, the shielding layer 312 may also negatively affect the performance of the passive on glass devices in the integrated passive device layer 330. Negative interaction between the integrated passive device layer 330 and the shielding layer 312 may result from height and/or volume reduction of the integrated circuit device 300. In addition, due to the location of the ground plane 310 below the die 320, there is reduced space left in the substrate 322 for other uses of the interconnect layers of the substrate (e.g., the M1 and M2 layers).

According to aspects of the present disclosure, a backside ground plane is added to a passive die of an RF module by depositing a conductive layer on a backside of the passive die, distal from an integrated passive device layer. This feature enables strict control over the distance between the integrated passive device layer and the backside ground plane. In particular, strict control over a thickness (e.g., height) of the passive die prevents the backside ground plane from negatively affecting the performance of the integrated passive devices by reducing the ground plane distance variation. Aspects of the present disclosure integrate a shielding ground plane of the RF module and the backside ground plane of a passive die, thereby avoiding the use of a substrate ground plane using an interconnect layer (e.g., metal three (M3)). The shielding ground plane may be provided by electrically coupling the backside ground plane to a shielding layer partially surrounding the RF module.

Figure 4:
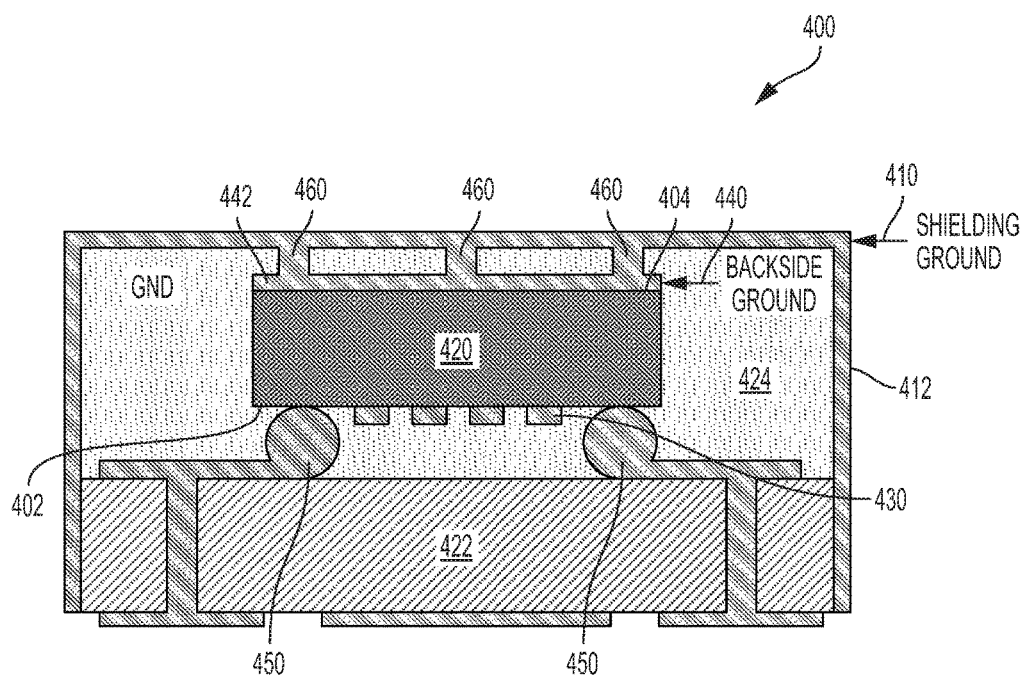
FIG. 4 is a cross-sectional view illustrating an integrated circuit (IC) device including a backside ground integrated with a shielding ground plane, according to aspects of the present disclosure.

FIG. 4 is a cross-sectional view illustrating an integrated circuit (IC) device 400 including a shielding ground plane 410 integrated with a backside ground plane 440, according to aspects of the present disclosure. The integrated circuit device 400 (e.g., RF module) may include a die 420 (e.g., a passive die) surrounded by a molding compound 424. The die 420 may be formed from a passive substrate. The passive substrate may refer to a substrate of a diced wafer or panel, or may refer to the substrate of a wafer/panel that is not diced. In one configuration, the passive substrate is comprised of glass, air, quartz, sapphire, high-resistivity silicon, or other like passive material. The passive substrate may also be a coreless substrate.

The die 420 may include an integrated passive device (IPD) layer 430 on a front side 402 of the die 420. The integrated passive device layer 430 may include passive devices and components implemented as passive on glass devices, integrated passive devices, or other like passive devices, for example, as shown in FIGS. 2A and 2B. The integrated passive device layer 430 may include, for example, the inductors (L) and capacitors (C) arranged along a substrate (e.g., substrate 202). These various inductors and capacitors may be arranged in the integrated passive device layer 430 to form diplexers, triplexers, low pass filters, balun filters, and/or notch filters to prevent high order harmonics in the RF front end module 250, as shown in FIG. 2B.

The die 420 may further be supported by a substrate 422. The substrate 422 may be a printed circuit board (PCB), a packaging substrate, a wafer level chip scale package (WLCSP), an interposer, or other like system board. According to an aspect, the die 420 is electrically coupled to the substrate 422 through conductive interconnects 450 (e.g., solder balls). The conductive interconnects 450, however, do not electrically couple the die 420 to a ground plane of the substrate 422, for example, as shown in FIG. 3.

In this arrangement, a shielding layer 412 (e.g., copper) partially surrounds the die 420 by conformally depositing the shielding layer 412 on the molding compound 424 and sidewall of the substrate 422. The shielding layer 412 that covers the sidewalls of the substrate 422 and the molding compound 424 may be used to provide a shielding ground plane 410. The shielding ground plane 410 is integrated with the backside ground plane 440 formed from a conductive layer 442 that is on a backside 404 of the die 420. The conductive layer 442 may be on a surface distal from the integrated passive device layer 430. The backside ground plane 440 may also be distal from the integrated passive device layer 430. According to an aspect, conductive vias 460 electrically couple the shielding layer 412 to the conductive layer 442 for integrating the backside ground plane 440 and the shielding ground plane 410.

In this configuration, the shielding layer 412 functions as both a ground plane and a shielding layer. Because a thickness of the die 420 is uniform, the integrated passive device layer 430 may be a uniform distance from the backside ground plane 440. This feature enables strict control over the distance between the integrated passive device layer 430 and the backside ground plane 440, which helps define the inductance values accurately. The shielding layer 412 also prevents interference from the integrated circuit device 400 from affecting other electrical components in a RF communication system. By including the backside ground plane 440 on the backside of the die 420, space is saved on the substrate 422 that may be used for other purposes, such as circuitry designs for routing and inductors.

FIGS. 5A-5D are cross-sectional views of an integrated circuit (IC) device illustrating a backside ground plane integrated with a shielding ground plane manufacturing process, according to aspects of the present disclosure.

Figure 5A:
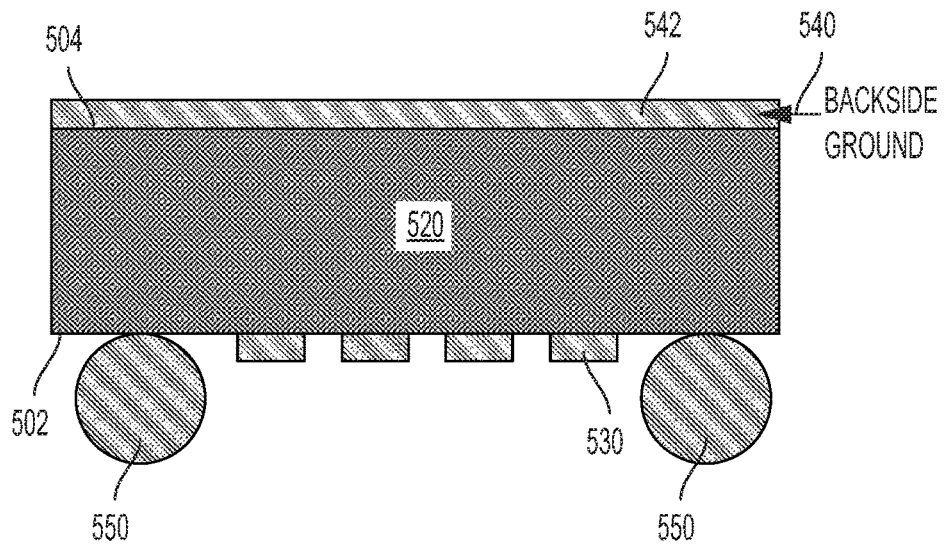
FIGS. 5A-5D are cross-sectional views of an integrated circuit (IC) device illustrating an backside ground plane and a shielding ground plane manufacturing process, according to aspects of the present disclosure.

FIG. 5A shows a passive die 520 including an integrated passive device (IPD) layer 530 on a front side surface 502 of a passive die 520. The integrated passive device layer 530 also includes passive devices and components implemented as passive on glass devices, integrated passive devices, or other like passive devices, for example, as shown in FIGS. 2A and 2B. The passive die 520 may further include conductive interconnects 550 (e.g., solder balls) on the front side 502 and a backside conductive layer 542 on a backside surface 504 of the passive die 520. The backside conductive layer 542 is on a backside surface 504 of the passive die 520, distal from the integrated passive device layer 530 to provide a backside ground plane 540.

Figure 5B:
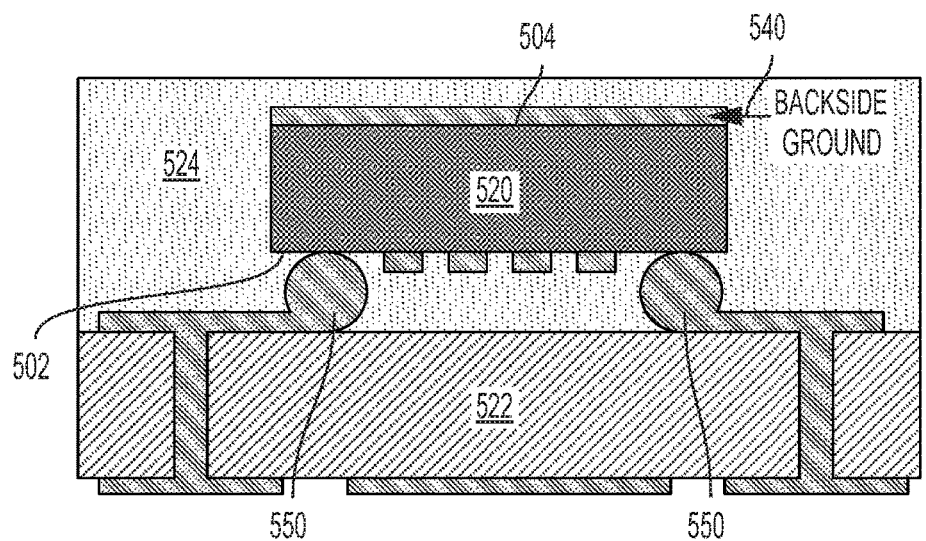

FIG. 5B shows the passive die 520 electrically coupled to and supported by a packaging substrate 522. The packaging substrate 522 may also be a printed circuit board (PCB), a wafer level chip scale package (WLCSP), an interposer, or other like substrate. According to an aspect of the present disclosure, the passive die 520 is surrounded by a molding compound 524 (e.g., molding layer).

Figure 5C:
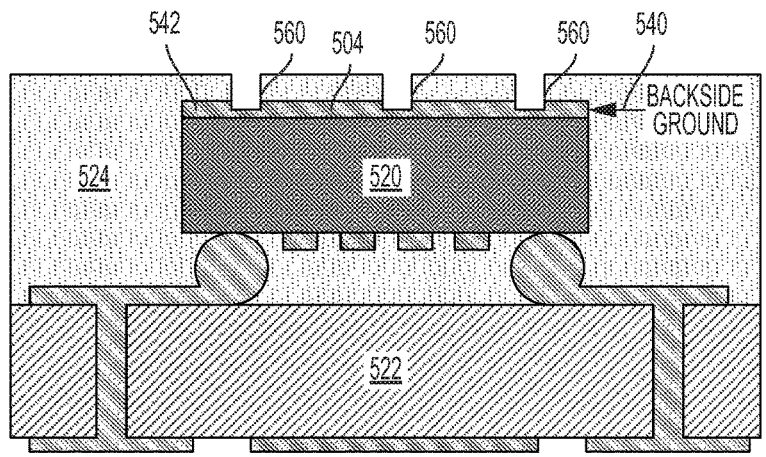

FIG. 5C shows vias 560 formed after drilling into the molding compound 524. For example, laser drilling into the molding compound 524 may be used to form the vias 560. The vias 560 expose portions of the backside conductive layer 542 on the backside surface 504 of the passive die 520 to enable integration of the backside ground plane 540 with a shielding ground plane 510, as shown in FIG. 5D.

Figure 5D:
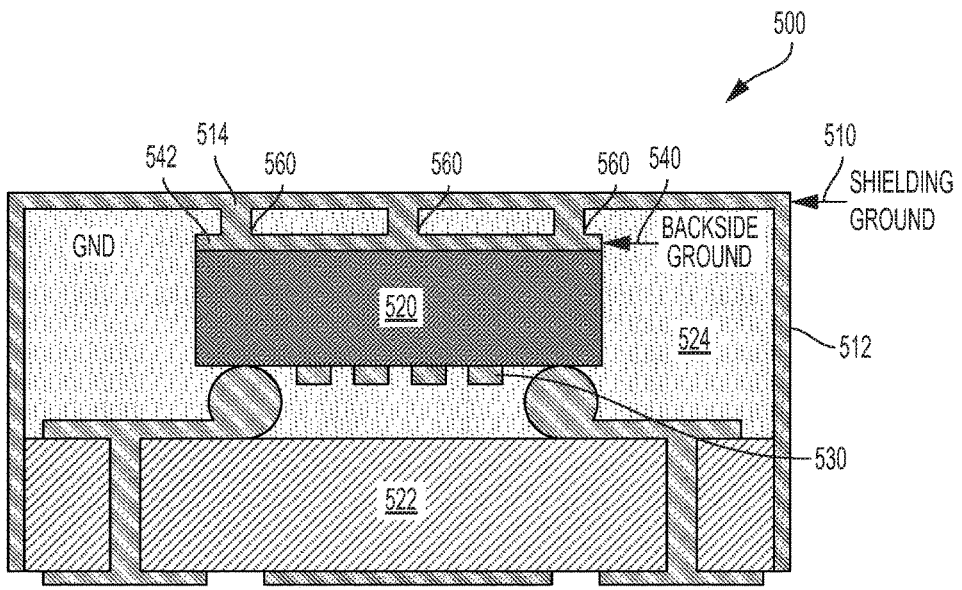

FIG. 5D shows the integrated circuit device 500. Integration of the backside ground plane 540 with the shielding ground plane 510 may be performed by depositing a conductive material 514 into the vias 560 and on exposed portions of the backside conductive layer 542. According to an aspect, depositing the conductive material 514 includes conformally coating the molding compound 524. The conductive material 514 may also cover the sidewalls of the packaging substrate 522. According to a related aspect, the conductive material 514 also forms a shielding layer 512. In this arrangement, the vias 560 enable integration between the backside ground plane 540 and the shielding ground plane 510.

As described above, the shielding layer 512 functions as both a backside ground and a shielding layer for the integrated circuit device 500. A thickness of the passive die 520 may be uniform for maintaining a uniform distance between the integrated passive device layer 530 and the backside ground plane 540. As a result of the uniform distance between the integrated passive device layer 530 and the backside ground plane 540, the passive devices on the integrated passive device layer 530 may be well defined with respect to the backside ground plane 540 (e.g., backside conductive layer 542). Additionally, the shielding layer 512 may prevent interference between the integrated circuit device 500 and other electrical components in a RF communication system. Space within the interconnect layers of the packaging substrate 522 (e.g., the M1 and M2 layers) is also saved on the packaging substrate 522 by including the backside ground plane 540. This extra space may be used for other purposes, such as circuitry designs for routing and inductors.

Figure 6:
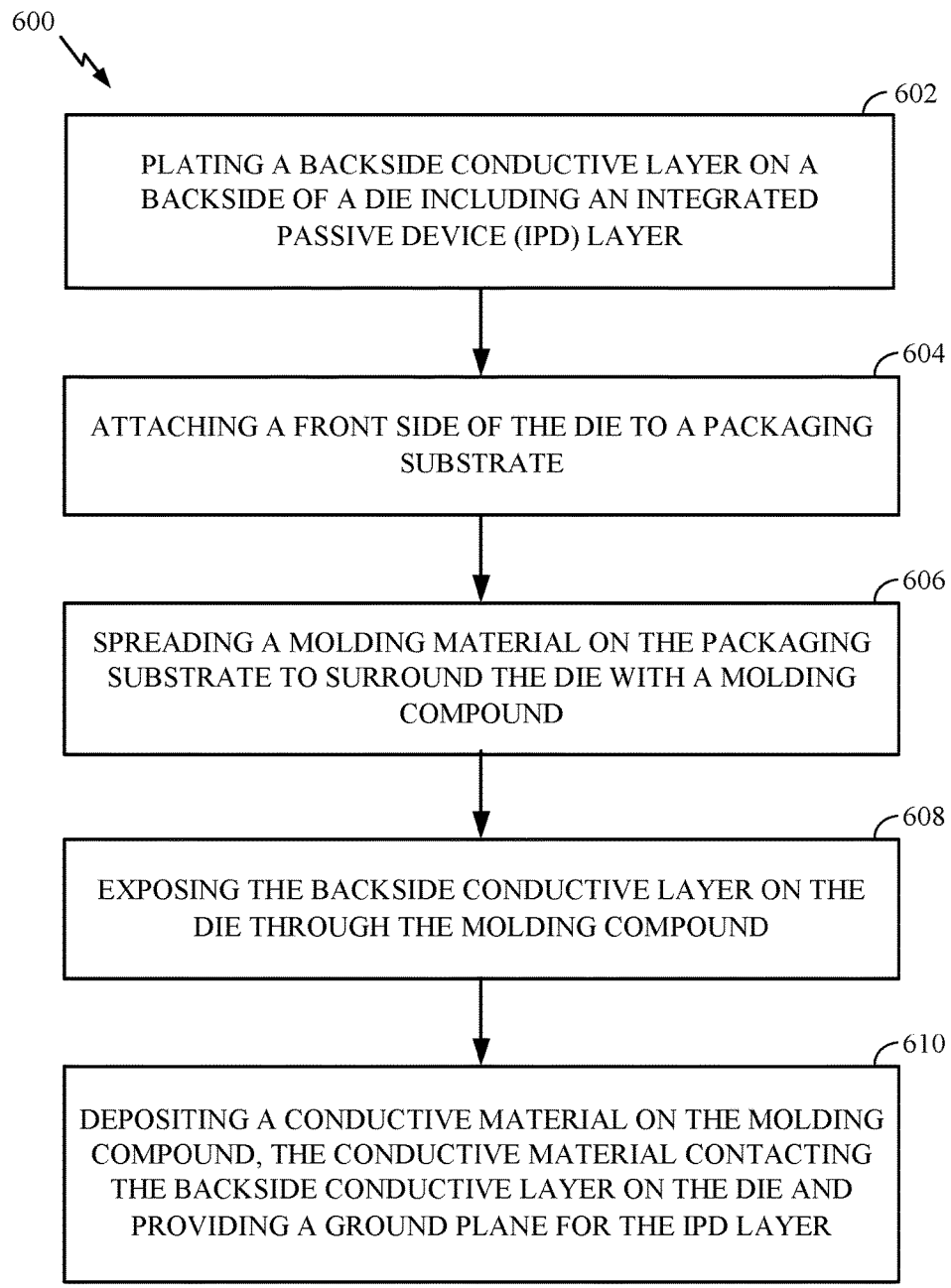
FIG. 6 illustrates a method of fabricating an integrated circuit (IC) device including a backside ground plane and a shielding ground plane according to aspects of the present disclosure.

FIG. 6 illustrates a method 600 of fabricating an integrated circuit (IC) device (e.g., a module) including a backside ground according to aspects of the present disclosure. In block 602, a backside conductive layer is plated on a backside of a passive die including the integrated passive device layer. As shown in FIG. 5A, plating on the backside surface 504 of the passive die 520 enables the formation of the backside conductive layer 542 as a backside ground plane 540. According to an aspect of the present disclosure, the integrated passive device layer 530 includes inductors and capacitors. Conductive interconnects 550 (e.g., solder balls) may also be coupled to the front side 502 of the passive die 520. The backside conductive layer 542 may be on a surface distal from the integrated passive device layer 530.

Referring again to FIG. 6, in block 604, a front side of the passive die is attached to a packaging substrate. As shown in FIG. 5B, the passive die 520 may be attached through the conductive interconnects 550. In block 606, a molding material is spread on the packaging substrate to surround the passive die with a molding compound, which is also shown in FIG. 5B. In block 608, the backside conductive layer is exposed on the passive die through the molding compound. As shown in FIG. 5C, the exposing can include drilling through the molding compound 524. The drilling may be accomplished with laser drilling.

As further illustrated in block 610 of FIG. 6, a conductive material is deposited on the molding compound. As shown in FIG. 5D, the conductive material 514 may contact the backside conductive layer 542 on the passive die 520 and may provide a shielding ground plane 510 for the integrated passive device layer 530. According to an aspect, the depositing includes conformally coating the molding compound 524. The conductive material 514 may also cover sidewalls of the packaging substrate 522 and the molding compound 524, as shown in FIG. 5D. The shielding ground plane 510 is formed from a shielding layer 512 that surrounds a portion of the passive die 520 and the packaging substrate 522.

The uniform thickness of the passive die 520 enables strict control over the distance between the integrated passive device layer 530 and the backside ground plane 540. As such, the devices on the integrated passive device layer 530 may be better calibrated to minimize interference with the shielding layer 512 (e.g., conductive material 514). The shielding layer 512 also prevents interference between the integrated circuit device 500 and other electrical components in a RF communication system. By including the backside ground plane 540 on the backside surface 504 of the integrated circuit device 500, space is saved in the packaging substrate 522 that may be used for other purposes, such as circuitry designs for routing and inductors on the M1, M2, and M3 layers, for example.

According to the present disclosure, an integrated circuit device includes a backside ground plane. The integrated circuit device is arranged so that a ground plane is coupled to a backside conductive layer on a backside of a die. The integrated circuit device includes means for coupling the backside conductive layer to the ground plane. The means for coupling may be the conductive vias 460 and/or the vias 560 (e.g., conductive vias), as shown in FIGS. 4, 5C, and 5D. In another aspect, the aforementioned means may be any module or any apparatus configured to perform the functions recited by the aforementioned means.

The implementation of carrier aggregation in mobile RF transceivers enables a wireless carrier to increase data throughput. While an increased amount of data is provided to the end user, successful implementation of carrier aggregation is complicated by noise created at the harmonic frequencies due to the frequencies used for data transmission. This noise is reduced when passive devices are used to process signals carried in a carrier aggregation system.

Spacing considerations affect mobile RF transceiver design at deep sub-micron process nodes. For example, a distance between passive devices (e.g., passive on glass (POG) devices or integrated passive devices (IPD)) and a ground plane of a system board (e.g., a printed circuit broad (PCB)) affects the performance of the RF devices of the RF transceiver. Additionally, depending on a distance between the passive devices and a shielding layer, the shielding layer may also negatively affect the performance of the POG devices in the IPD layer.

Aspects of the present disclosure are directed to integrated circuit (IC) devices. In one configuration, an IC device includes a first substrate (e.g., a glass substrate) having a conductive layer. The first substrate may include a layer of passive devices on a first side of the first substrate. The integrated circuit device also includes a second substrate, which may be a printed circuit board (PCB), a packaging substrate, an interposer, or other like system board. A ground plane may be coupled to a second side of the first substrate.

In this configuration, the ground plane may include a shielding layer that surrounds the IC device.

According to aspects of the present disclosure, a backside conductive layer is added to a backside of a die, distal from an IPD layer. This feature enables strict control over the distance between the IPD layer and the ground plane, such that the shielding layer does not adversely affect the IPD devices. Aspects of the present disclosure integrate a ground plane to a backside of a passive glass die, rather than in the M3 layer of the substrate. A distance between the ground plane and components is controlled/optimized by a glass die thickness, thereby enabling better performance.

Figure 7:
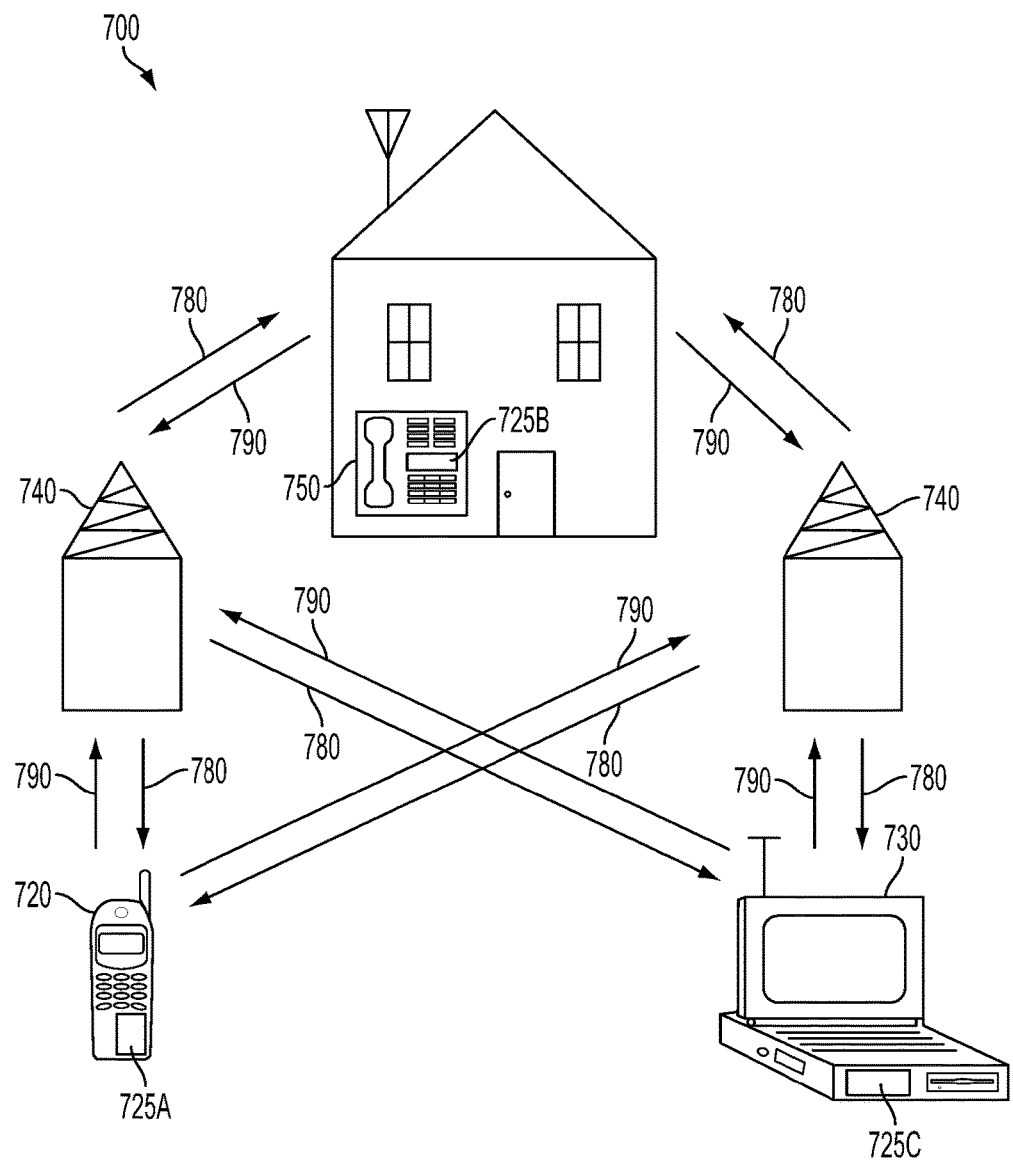
FIG. 7 is a block diagram showing an exemplary wireless communication system in which an aspect of the disclosure may be advantageously employed.

FIG. 7 is a block diagram showing an exemplary wireless communication system 700 in which an aspect of the disclosure may be advantageously employed. For purposes of illustration, FIG. 7 shows three of the remote units 720, 730, and 750 and two of the base stations 740. It will be recognized that wireless communication systems may have many more remote units and base stations. Remote units 720, 730, and 750 include IC devices 725A, 725C, and 725B that include the disclosed backside ground plane. It will be recognized that other devices may also include the disclosed backside ground plane, such as the base stations, switching devices, and network equipment. FIG. 7 shows forward link signals 780 from one of the base stations 740 to the remote units 720, 730, and 750 and reverse link signals 790 from the remote units 720, 730, and 750 to base stations 740.

In FIG. 7, one of the remote units 720 is shown as a mobile telephone, one of the remote units 730 is shown as a portable computer, and remote unit 750 is shown as a fixed location remote unit in a wireless local loop system. For example, the remote units may be a mobile phone, a hand-held personal communication systems (PCS) unit, a portable data unit such as a personal digital assistant (PDA), a GPS enabled device, a navigation device, a set top box, a music player, a video player, a communications device, an entertainment unit, a fixed location data unit such as a meter reading equipment, or other devices that store or retrieve data or computer instructions, or combinations thereof. Although FIG. 7 illustrates remote units according to the aspects of the disclosure, the disclosure is not limited to these exemplary illustrated units. Aspects of the disclosure may be suitably employed in many devices, which include the disclosed backside ground plane.

Figure 8:
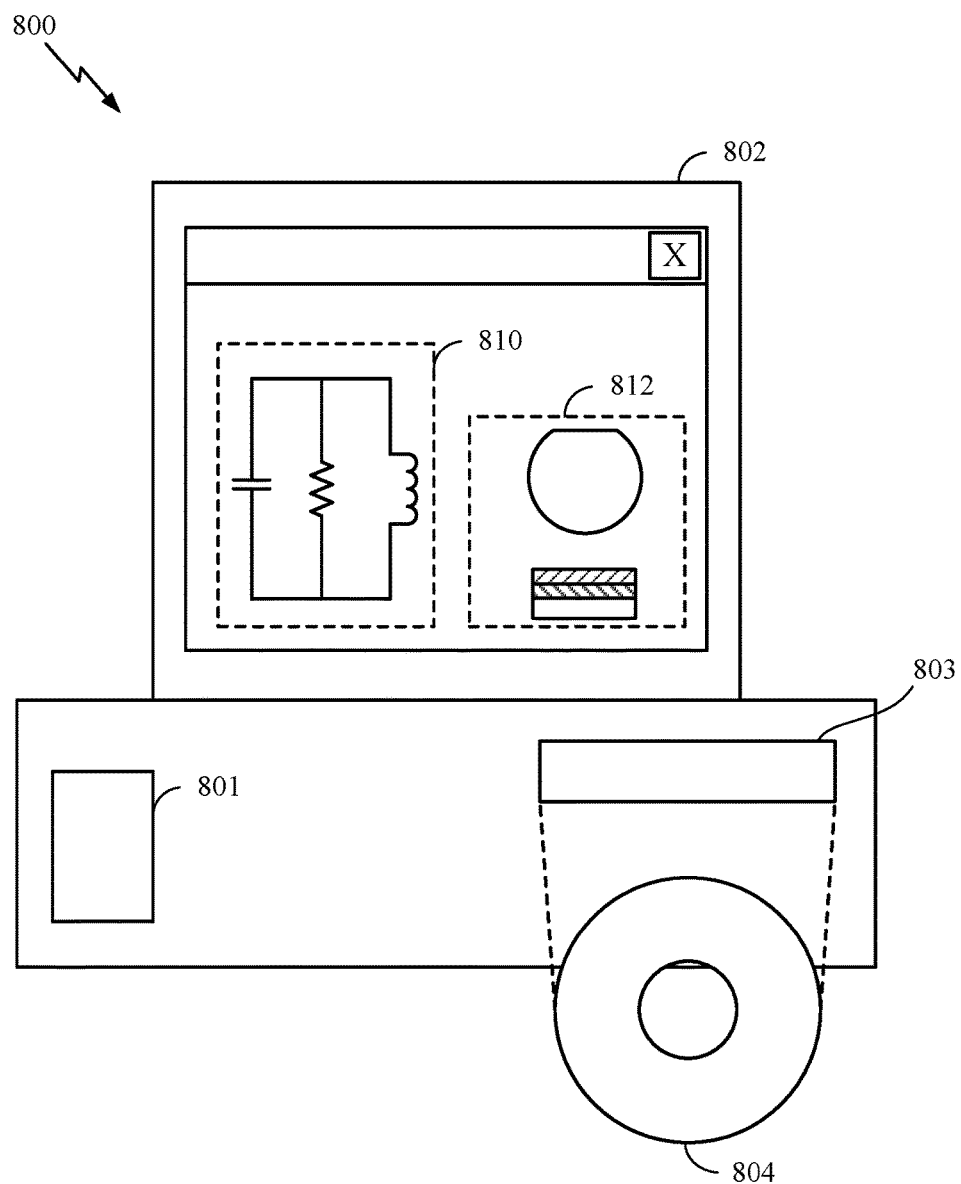
FIG. 8 is a block diagram illustrating a design workstation used for circuit, layout, and logic design of a semiconductor component according to one aspect of the present disclosure.

FIG. 8 is a block diagram illustrating a design workstation used for circuit, layout, and logic design of the multi-density metal-insulator-metal (MIM) capacitors disclosed above. A design workstation 800 includes a hard disk 801 containing operating system software, support files, and design software such as Cadence or OrCAD. The design workstation 800 also includes a display 802 to facilitate design of a circuit 810 or the backside ground plane 812. A storage medium 804 is provided for tangibly storing the design of the circuit 810 or the backside ground plane 812. The design of the circuit 810 or the backside ground plane 812 may be stored on the storage medium 804 in a file format such as GDSII or GERBER. The storage medium 804 may be a CD-ROM, DVD, hard disk, flash memory, or other appropriate device. Furthermore, the design workstation 800 includes a drive apparatus 803 for accepting input from or writing output to the storage medium 804.

Data recorded on the storage medium 804 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 804 facilitates the design of the circuit 810 or the backside ground plane 812 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. An integrated circuit (IC) device, comprising:
   a die including an integrated passive device (IPD) layer;
   a substrate supporting the die;
   a molding compound surrounding the die;
   a backside conductive layer on a surface of the die that is distal from the IPD layer; and
   a plurality of vias coupling the backside conductive layer to a ground plane through the molding compound, in which the ground plane is on a backside of the molding compound.

2. The IC device of claim 1, in which the IPD layer comprises inductors and capacitors.

3. The IC device of claim 1, in which the ground plane comprises a shielding layer surrounding a portion of the molding compound and the substrate.

4. The IC device of claim 3, in which the shielding layer is arranged to cover sidewalls of the substrate.

5. The IC device of claim 1, in which the ground plane is distal from the IPD layer.

6. The IC device of claim 1, further comprising solder balls on a front side of the die for electrically coupling the substrate to the die.

7. The IC device of claim 1, integrated into a radio frequency (RF) front end module, the RF front end module incorporated into at least one of a music player, a video player, an entertainment unit, a navigation device, a communications device, a personal digital assistant (PDA), a fixed location data unit, a mobile phone, and a portable computer.

8. A method of fabricating an integrated circuit (IC) device, comprising:
   plating a backside conductive layer on a backside of a die including an integrated passive device (IPD) layer;
   attaching a front side of the die to a packaging substrate;
   spreading a molding material on the packaging substrate to surround the die with a molding compound;
   exposing the backside conductive layer on the die through the molding compound; and
   depositing a conductive material on the molding compound, the conductive material contacting the backside conductive layer on the die and providing a ground plane for the IPD layer, in which the ground plane is on a backside of the molding compound.

9. The method of claim 8, in which the exposing comprises drilling through the molding material.

10. The method of claim 8, in which the depositing comprises conformally coating the molding compound.

11. The method of claim 8, in which the conductive material is arranged to cover sidewalls of the packaging substrate.

12. The method of claim 8, in which the IPD layer comprises inductors and capacitors.

13. The method of claim 8, in which the ground plane comprises a shielding layer surrounding a portion of the die and the packaging substrate.

14. The method of claim 8, further comprising integrating the IC device into a radio frequency (RF) front end module, the RF front end module incorporated into at least one of a music player, a video player, an entertainment unit, a navigation device, a communications device, a personal digital assistant (PDA), a fixed location data unit, a mobile phone, and a portable computer.

15. An integrated circuit (IC) device, comprising:
   a die including an integrated passive device (IPD) layer;
   a substrate supporting the die;
   a molding compound surrounding the die;
   a backside conductive layer on a surface of the die that is distal from the IPD layer; and
   means for coupling the backside conductive layer to a ground plane, in which the ground plane is on a backside of the molding compound.

16. The IC device of claim 15, integrated into a radio frequency (RF) front end module, the RF front end module incorporated into at least one of a music player, a video player, an entertainment unit, a navigation device, a communications device, a personal digital assistant (PDA), a fixed location data unit, a mobile phone, and a portable computer.

17. A radio frequency (RF) front end module, comprising:
   a filter, comprising a die including an integrated passive device (IPD) layer, a substrate supporting the die, a molding compound surrounding the die, a backside conductive layer on a surface of the die that is distal from the IPD layer, and a plurality of vias coupling the backside conductive layer to a ground plane, in which the ground plane is on a backside of the molding compound;
   a diplexer coupled to the filter; and
   an antenna coupled to an output of the diplexer.

18. The RF front end module of claim 17, in which the IPD layer comprises inductors and capacitors.

19. The RF front end module of claim 17, incorporated into at least one of a music player, a video player, an entertainment unit, a navigation device, a communications device, a personal digital assistant (PDA), a fixed location data unit, a mobile phone, and a portable computer.

* * * * *